(12) United States Patent
Zhang et al.

(10) Patent No.: US 9,274,889 B2
(45) Date of Patent: Mar. 1, 2016

(54) SYSTEMS AND METHODS FOR DATA PROCESSING USING GLOBAL ITERATION RESULT REUSE

(71) Applicant: LSI Corporation, San Jose, CA (US)

(72) Inventors: Fan Zhang, Milpitas, CA (US); Shu Li, San Jose, CA (US); Jun Xiao, Fremont, CA (US); Kaitlyn T. Nguyen, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 110 days.

(21) Appl. No.: 13/912,059

(22) Filed: Jun. 6, 2013

(65) Prior Publication Data

US 2014/0359393 A1     Dec. 4, 2014

Related U.S. Application Data

(60) Provisional application No. 61/828,078, filed on May 28, 2013.

(51) Int. Cl.
| | |
|---|---|
| *G06F 11/10* | (2006.01) |
| *H03M 13/11* | (2006.01) |
| *H03M 13/27* | (2006.01) |
| *H03M 13/00* | (2006.01) |
| *H03M 13/29* | (2006.01) |

(52) U.S. Cl.
CPC ....... *G06F 11/1076* (2013.01); *H03M 13/1111* (2013.01); *H03M 13/27* (2013.01); *H03M 13/2957* (2013.01); *H03M 13/6331* (2013.01); *H03M 13/658* (2013.01); *H03M 13/6583* (2013.01); *H03M 13/2948* (2013.01); *H04L 2201/06* (2013.01)

(58) Field of Classification Search
CPC .......... H04L 2201/06; H03M 13/2948; H03M 13/1102
USPC .................................. 714/774, 758
See application file for complete search history.

(56) References Cited

U.S. PATENT DOCUMENTS

| | | | |
|---|---|---|---|
| 4,553,221 | A | 11/1985 | Hyatt |
| 4,805,174 | A | 2/1989 | Kubot |

(Continued)

FOREIGN PATENT DOCUMENTS

| | | |
|---|---|---|
| JP | 2001/319433 A | 11/2001 |
| WO | WO 2010/059264 A1 | 5/2010 |
| WO | WO 2010/126482 A1 | 11/2010 |

OTHER PUBLICATIONS

U.S. Appl. No. 13/426,714, filed Mar. 22, 2012, Shaohua Yang.

(Continued)

*Primary Examiner* — M. Mujtaba K Chaudry

(57) ABSTRACT

The present inventions are related to systems and methods for data processing, and more particularly to systems and methods for use of a detector output by a data decoder. As an example, a data processing system is discussed that includes a data detector circuit operable to provide a first detector output and a second detector output, and a combining circuit operable to combine a first input derived from the first detector output with a second input derived from the second detector output to yield a combined detector output. The combined detector output includes a unified data set element generated by combining an element of the first input with a corresponding element of the second input.

20 Claims, 6 Drawing Sheets

(56) References Cited

U.S. PATENT DOCUMENTS

| | | |
|---|---|---|
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,351,274 A | 9/1994 | Chennakeshu |
| 5,392,299 A | 2/1995 | Rhines |
| 5,406,593 A | 4/1995 | Chennakeshu |
| 5,417,500 A | 5/1995 | Martinie |
| 5,450,253 A | 9/1995 | Seki |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,696,504 A | 12/1997 | Oliveros |
| 5,710,784 A | 1/1998 | Kindred |
| 5,717,706 A | 2/1998 | Ikeda |
| 5,719,871 A | 2/1998 | Helm |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccalissister |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,175,588 B1 | 1/2001 | Visotsky |
| 6,216,249 B1 | 4/2001 | Bliss |
| 6,216,251 B1 | 4/2001 | McGinn |
| 6,266,795 B1 | 7/2001 | Wei |
| 6,317,472 B1 | 11/2001 | Choi |
| 6,351,832 B1 | 2/2002 | Wei |
| 6,377,610 B1 | 4/2002 | Hagenauer |
| 6,381,726 B1 | 4/2002 | Weng |
| 6,393,074 B1 | 5/2002 | Mandyam |
| 6,412,088 B1 | 6/2002 | Patapoutian et al. |
| 6,473,878 B1 | 10/2002 | Wei |
| 6,535,553 B1 | 3/2003 | Limberg et al. |
| 6,625,775 B1 | 9/2003 | Kim |
| 6,697,441 B1 | 2/2004 | Bottomley |
| 6,748,034 B2 | 6/2004 | Hattori |
| 6,757,862 B1 | 6/2004 | Marianetti, II |
| 6,785,863 B2 | 8/2004 | Blankenship |
| 6,807,238 B1 | 10/2004 | Rhee |
| 6,810,502 B2 | 10/2004 | Eidson |
| 6,839,774 B1 | 1/2005 | Ahn et al. |
| 6,970,511 B1 | 11/2005 | Barnette |
| 6,975,692 B2 | 12/2005 | Razzell |
| 6,986,098 B2 | 1/2006 | Poeppelman |
| 7,035,327 B2 | 4/2006 | Nakajima et al. |
| 7,047,474 B2 | 5/2006 | Rhee |
| 7,058,853 B1 | 6/2006 | Kavanappillil et al. |
| 7,058,873 B2 | 6/2006 | Song |
| 7,073,118 B2 | 7/2006 | Greenberg |
| 7,093,179 B2 | 8/2006 | Shea |
| 7,117,427 B2 | 10/2006 | Ophir |
| 7,133,228 B2 | 11/2006 | Fung |
| 7,136,244 B1 | 11/2006 | Rothberg |
| 7,184,486 B1 | 2/2007 | Wu |
| 7,191,378 B2 | 3/2007 | Eroz |
| 7,203,887 B2 | 4/2007 | Eroz |
| 7,230,550 B1 | 6/2007 | Mittal |
| 7,237,181 B2 | 6/2007 | Richardson |
| 7,308,061 B1 | 12/2007 | Huang |
| 7,310,768 B2 | 12/2007 | Eidson |
| 7,313,750 B1 | 12/2007 | Feng |
| 7,370,258 B2 | 5/2008 | Iancu |
| 7,415,651 B2 | 8/2008 | Argon |
| 7,502,189 B2 | 3/2009 | Sawaguchi |
| 7,523,375 B2 | 4/2009 | Spencer |
| 7,587,657 B2 | 9/2009 | Haratsch |
| 7,590,168 B2 | 9/2009 | Raghavan |
| 7,596,196 B1 | 9/2009 | Liu et al. |
| 7,646,829 B2 | 1/2010 | Ashley |
| 7,702,986 B2 | 4/2010 | Bjerke |
| 7,738,202 B1 | 6/2010 | Zheng |
| 7,752,523 B1 | 7/2010 | Chaichanavong |
| 7,779,325 B2 * | 8/2010 | Song .............................. 714/752 |
| 7,802,172 B2 | 9/2010 | Casado |
| 7,952,824 B2 | 5/2011 | Dziak |
| 7,957,251 B2 | 6/2011 | Ratnakar Aravind |
| 7,958,425 B2 | 6/2011 | Chugg |
| 7,996,746 B2 | 8/2011 | Livshitz |
| 8,018,360 B2 | 9/2011 | Nayak |
| 8,020,069 B1 | 9/2011 | Feng |
| 8,020,078 B2 | 9/2011 | Richardson |
| 8,161,361 B1 | 4/2012 | Song et al. |
| 8,201,051 B2 | 6/2012 | Tan |
| 8,225,168 B2 | 7/2012 | Yu et al. |
| 8,237,597 B2 | 8/2012 | Liu |
| 8,255,765 B1 | 8/2012 | Yeo |
| 8,261,171 B2 | 9/2012 | Annampedu |
| 8,291,284 B2 | 10/2012 | Savin |
| 8,291,299 B2 | 10/2012 | Li |
| 8,295,001 B2 | 10/2012 | Liu |
| 8,296,637 B1 | 10/2012 | Varnica |
| 8,370,711 B2 | 2/2013 | Alrod |
| 8,381,069 B1 | 2/2013 | Liu |
| 8,413,032 B1 | 4/2013 | Song |
| 8,429,498 B1 | 4/2013 | Anholt |
| 8,443,267 B2 | 5/2013 | Zhong et al. |
| 8,458,555 B2 | 6/2013 | Gunnam |
| 8,464,142 B2 | 6/2013 | Gunnam |
| 2001/0010089 A1 | 7/2001 | Gueguen |
| 2001/0016114 A1 | 8/2001 | Van Gestel et al. |
| 2002/0021519 A1 | 2/2002 | Rae |
| 2002/0067780 A1 | 6/2002 | Razzell |
| 2002/0168033 A1 | 11/2002 | Suzuki |
| 2003/0031236 A1 | 2/2003 | Dahlman |
| 2003/0123364 A1 | 7/2003 | Nakajima et al. |
| 2003/0138102 A1 | 7/2003 | Kohn et al. |
| 2003/0147168 A1 | 8/2003 | Galbraith et al. |
| 2003/0188252 A1 | 10/2003 | Kim |
| 2004/0042436 A1 | 3/2004 | Terry et al. |
| 2004/0194007 A1 | 9/2004 | Hocevar |
| 2004/0228021 A1 | 11/2004 | Yamazaki |
| 2005/0047514 A1 | 3/2005 | Bolinth |
| 2005/0149842 A1 | 7/2005 | Kyung |
| 2005/0210367 A1 | 9/2005 | Ashikhmin |
| 2005/0243456 A1 | 11/2005 | Mitchell et al. |
| 2006/0002689 A1 | 1/2006 | Yang et al. |
| 2006/0156171 A1 * | 7/2006 | Kuznetsov et al. ........... 714/755 |
| 2006/0159355 A1 | 7/2006 | Mizuno |
| 2007/0234178 A1 | 10/2007 | Richardson |
| 2007/0297496 A1 | 12/2007 | Park et al. |
| 2008/0037676 A1 | 2/2008 | Kyun et al. |
| 2008/0069373 A1 | 3/2008 | Jiang |
| 2008/0140686 A1 | 6/2008 | Hong |
| 2008/0304558 A1 | 12/2008 | Zhu et al. |
| 2009/0003301 A1 | 1/2009 | Reial |
| 2009/0092174 A1 | 4/2009 | Wang |
| 2009/0106633 A1 | 4/2009 | Fujiwara |
| 2009/0125780 A1 | 5/2009 | Taylor |
| 2009/0132893 A1 | 5/2009 | Miyazaki |
| 2009/0150745 A1 | 6/2009 | Langner et al. |
| 2009/0177852 A1 | 7/2009 | Chen |
| 2009/0185643 A1 | 7/2009 | Fitzpatrick |
| 2009/0273492 A1 * | 11/2009 | Yang et al. ..................... 341/81 |
| 2010/0077276 A1 | 3/2010 | Okamura et al. |
| 2010/0088575 A1 | 4/2010 | Sharon et al. |
| 2010/0150252 A1 | 6/2010 | Camp |
| 2010/0172046 A1 | 7/2010 | Liu et al. |
| 2010/0241921 A1 | 9/2010 | Gunnam |
| 2010/0268996 A1 | 10/2010 | Yang |
| 2010/0322048 A1 | 12/2010 | Yang et al. |
| 2010/0325511 A1 | 12/2010 | Oh |
| 2011/0007859 A1 * | 1/2011 | Ueda et al. ..................... 375/376 |
| 2011/0041040 A1 | 2/2011 | Su |
| 2011/0043938 A1 | 2/2011 | Mathew |
| 2011/0167227 A1 * | 7/2011 | Yang et al. ..................... 711/154 |

(56) References Cited

U.S. PATENT DOCUMENTS

| | | | |
|---|---|---|---|
| 2011/0258508 A1 | 10/2011 | Ivkovic | |
| 2011/0264980 A1* | 10/2011 | Li et al. | 714/752 |
| 2011/0264987 A1 | 10/2011 | Li | |
| 2011/0307760 A1 | 12/2011 | Pisek | |
| 2011/0320902 A1 | 12/2011 | Gunnam | |
| 2012/0020402 A1 | 1/2012 | Ibing | |
| 2012/0038998 A1 | 2/2012 | Mathew | |
| 2012/0063023 A1 | 3/2012 | Mathew | |
| 2012/0079353 A1 | 3/2012 | Liikanen | |
| 2012/0124118 A1 | 5/2012 | Ivkovic | |
| 2012/0182643 A1 | 7/2012 | Zhang | |
| 2012/0185744 A1 | 7/2012 | Varnica | |
| 2012/0207201 A1 | 8/2012 | Xia | |
| 2012/0212849 A1 | 8/2012 | Xu | |
| 2012/0236428 A1 | 9/2012 | Xia | |
| 2012/0262814 A1 | 10/2012 | Li | |
| 2012/0265488 A1 | 10/2012 | Sun | |
| 2012/0317462 A1 | 12/2012 | Liu et al. | |
| 2013/0024740 A1 | 1/2013 | Xia | |
| 2013/0031440 A1 | 1/2013 | Sharon | |
| 2013/0120169 A1 | 5/2013 | Li | |
| 2013/0343494 A1* | 12/2013 | Bolinth et al. | 375/341 |
| 2014/0066114 A1* | 3/2014 | Kwon et al. | 455/501 |

OTHER PUBLICATIONS

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Patapoutian et al "Improving Re-Read Strategies by Waveform Averaging" IEEE Transactions on Mag. vol. 37 No. 6, Nov. 2001.

Richardson, T "Error Floors of LDPC Codes" Flarion Technologies Bedminster NJ 07921, tjr@flarion.com (not dated).

Shokrollahi "LDPC Codes: An Introduction", Digital Fountain, Inc. (Apr. 2, 2003).

Spagnol et al, "Hardware Implementation of GF(2m) LDPC Decoders", IEEE Transactions on Circuits and Systemssi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/305,551, filed Nov. 28, 2011, Yang Han, Unpublished.

U.S. Appl. No. 13/284,767, filed Oct. 28, 2011, Fan Zhang, Unpublished.

U.S. Appl. No. 13/770,008, filed Feb. 19, 2013, Shaohua Yang, Unpublished.

U.S. Appl. No. 13/227,544, filed Sep. 8, 2011, Shaohua Yang, Unpublished.

U.S. Appl. No. 13/186,234, filed Jul. 19, 2011, Haitao Xia, Unpublished.

U.S. Appl. No. 13/213,751, filed Aug. 19, 2011, Fan Zhang, Unpublished.

U.S. Appl. No. 13/283,549, filed Oct. 27, 2011, Wu Chang, Unpublished.

U.S. Appl. No. 13/180,495, filed Jul. 11, 2011, Chung-Li Wang, Unpublished.

U.S. Appl. No. 13/300,078, filed Nov. 18, 2011, Chung-Li Wang, Unpublished.

U.S. Appl. No. 13/302,119, filed Nov. 22, 2011, Lei Chen, Unpublished.

U.S. Appl. No. 13/227,416, filed Sep. 7, 2011, Lei Chen, Unpublished.

U.S. Appl. No. 13/296,022, filed Nov. 14, 2011, Victor Krachkovsky, Unpublished.

U.S. Appl. No. 13/174,537, filed Jun. 30, 2011, Anantha Raman Krishnan, Unpublished.

U.S. Appl. No. 13/174,453, filed Jun. 30, 2011, Johnson Yen, Unpublished.

U.S. Appl. No. 13/171,615, filed Jun. 29, 2011, Bradley D. Seago, Unpublished.

U.S. Appl. No. 13/113,219, filed May 23, 2011, Yang Han, Unpublished.

U.S. Appl. No. 13/295,150, filed Nov. 14, 2011, Zongwang Li, Unpublished.

U.S. Appl. No. 13/269,832, filed Oct. 10, 2011, Haitao Xia, Unpublished.

U.S. Appl. No. 13/305,510, filed Nov. 28, 2011, Lei Chen, Unpublished.

U.S. Appl. No. 13/705,407, filed Dec. 5, 2012, Lingyan Sun, Unpublished.

U.S. Appl. No. 13/597,001, filed Aug. 28, 2012, Fan Zhang, Unpublished.

U.S. Appl. No. 13/619,907, filed Sep. 14, 2012, Fan Zhang, Unpublished.

U.S. Appl. No. 13/284,730, filed Oct. 28, 2011, Fan Zhang, Unpublished.

U.S. Appl. No. 13/415,430, filed Mar. 8, 2012, Nayak Ratnakar Aravind, Unpublished.

U.S. Appl. No. 13/239,683, filed Sep. 22, 2011, Changyou Xu, Unpublished.

U.S. Appl. No. 13/989,583, filed Oct. 15, 2012, Shaohua Yang, Unpublished.

U.S. Appl. No. 13/483,100, filed May 30, 2012, Fan Zhang, Unpublished.

U.S. Appl. No. 13/596,978, filed Aug. 28, 2012, Fan Zhang, Unpublished.

U.S. Appl. No. 13/426,693, filed Mar. 22, 2012, Shaohua Yang, Unpublished.

(56) References Cited

OTHER PUBLICATIONS

U.S. Appl. No. 13/621,341, filed Sep. 17, 2012, Shaohua Yang, Unpublished.
U.S. Appl. No. 13/652,012, filed Oct. 15, 2012, Fan Zhang, Unpublished.
U.S. Appl. No. 13/746,301, filed Jan. 21, 2013, Shu Li, Unpublished.
U.S. Appl. No. 13/766,911, filed Feb. 14, 2013, Shaohua Yang, Unpublished.
U.S. Appl. No. 13/766,891, filed Feb. 14, 2013, Shu Li, Unpublished.
U.S. Appl. No. 13/875,357, filed May 2, 2013, Shaohua Yang, Unpublished.
U.S. Appl. No. 13/868,779, filed Apr. 23, 2013, Fan Zhang, Unpublished.
U.S. Appl. No. 13/853,711, filed Mar. 29, 2013, Shu Li, Unpublished.
U.S. Appl. No. 13/483,105, filed May 30, 2012, Xuebin Wu, Unpublished.
U.S. Appl. No. 13/445,848, filed Apr. 12, 2012, Bruce Wilson, Unpublished.
U.S. Appl. No. 13/412,520, filed Mar. 5, 2012, Fan Zhang, Unpublished.
U.S. Appl. No. 13/426,714, filed Mar. 22, 2012, Shaohua Yang, Unpublished.
U.S. Appl. No. 13/372,580, filed Feb. 14, 2012, Fan Zhang, Unpublished.
U.S. Appl. No. 13/415,326, filed Mar. 8, 2012, Shaohua Yang, Unpublished.
U.S. Appl. No. 13/316,858, filed Dec. 12, 2011, Zongwang Li, Unpublished.
U.S. Appl. No. 13/596,947, filed Aug. 28, 2012, Fan Zhang, Unpublished.
U.S. Appl. No. 13/316,741, filed Dec. 12, 2011, Yang Han, Unpublished.
U.S. Appl. No. 13/445,878, filed Apr. 12, 2012, Yu Liao, Unpublished.
U.S. Appl. No. 13/362,409, filed Jan. 31, 2012, Fan Zhang, Unpublished.
U.S. Appl. No. 13/340,974, filed Dec. 30, 2011, Dan Liu, Unpublished.
U.S. Appl. No. 13/340,951, filed Dec. 30, 2011, Lei Chen, Unpublished.
U.S. Appl. No. 13/369,468, filed Feb. 9, 2012, Zongwang Li, Unpublished.
U.S. Appl. No. 13/422,986, filed Mar. 16, 2012, Fan Zhang, Unpublished.
U.S. Appl. No. 13/474,660, filed May 17, 2012, Zongwang Li, Unpublished.
U.S. Appl. No. 13/433,693, filed Mar. 29, 2012, Fan Zhang, Unpublished.
U.S. Appl. No. 13/269,852, filed Oct. 10, 2011, Haitao Xia, Unpublished.
U.S. Appl. No. 13/545,833, filed Jul. 10, 2012, Zhi Bin Li, Unpublished.
U.S. Appl. No. 13/596,819, filed Aug. 28, 2012, Shaohua Yang, Unpublished.
U.S. Appl. No. 13/327,279, filed Dec. 15, 2011, Wei Feng, Unpublished.
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xiao, et al "Nested Codes With Multiple Interpretations" retrieved from the Internet URL: http://www.ece.nmsu.edu/~jkliewer/paper/XFKC_CISS06 (retrieved on Dec. 5, 2012).
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong, "Block-LDPC: A Practical LDPC Coding System Design Approach", IEEE Trans. on Circuits, Regular Papers, vol. 5, No. 4, pp. 766-775, Apr. 2005.

\* cited by examiner

SYSTEMS AND METHODS FOR DATA PROCESSING USING GLOBAL ITERATION RESULT REUSE

CROSS REFERENCE TO RELATED APPLICATIONS

The present application claims priority to (is a non-provisional of) U.S. Pat. App. No. 61/828,078, entitled "Systems and Methods for Data Processing Using Global Iteration Result Reuse", and filed May 28, 2013 by Zhang et al. The entirety of the aforementioned provisional patent application is incorporated herein by reference for all purposes.

BACKGROUND OF THE INVENTION

The present inventions are related to systems and methods for data processing, and more particularly to systems and methods for use of a detector output by a data decoder.

Various data transfer systems have been developed including storage systems, cellular telephone systems, radio transmission systems. In each of the systems data is transferred from a sender to a receiver via some medium. For example, in a storage system, data is sent from a sender (i.e., a write function) to a receiver (i.e., a read function) via a storage medium. In some cases, the data processing function uses a variable number of iterations through a data detector circuit and/or data decoder circuit depending upon the characteristics of the data being processed. Depending upon a number of factors, different data sets require more or fewer iterations through the data detector circuit and/or the data decoder circuit. In some cases, a data set being processed through a data processing circuit will not converge regardless of the number of iterations through the data detector circuit and/or the data decoder circuit.

Hence, for at least the aforementioned reasons, there exists a need in the art for advanced systems and methods for data processing.

BRIEF SUMMARY OF THE INVENTION

The present inventions are related to systems and methods for data processing, and more particularly to systems and methods for use of a detector output by a data decoder.

Some embodiments of the present invention provide data processing systems that include: a data detector circuit, a combining circuit, and a data decoder circuit. The data detector circuit is operable to apply a data detection algorithm to a data input to yield a first detector output, and to reapply the data detection algorithm to the data input to yield a second detector output. The combining circuit is operable to combine a first input derived from the first detector output with a second input derived from the second detector output to yield a combined detector output. The data decoder circuit is operable to apply a data decoding algorithm to a decoder input derived from the combined detector output to yield a decoded output.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
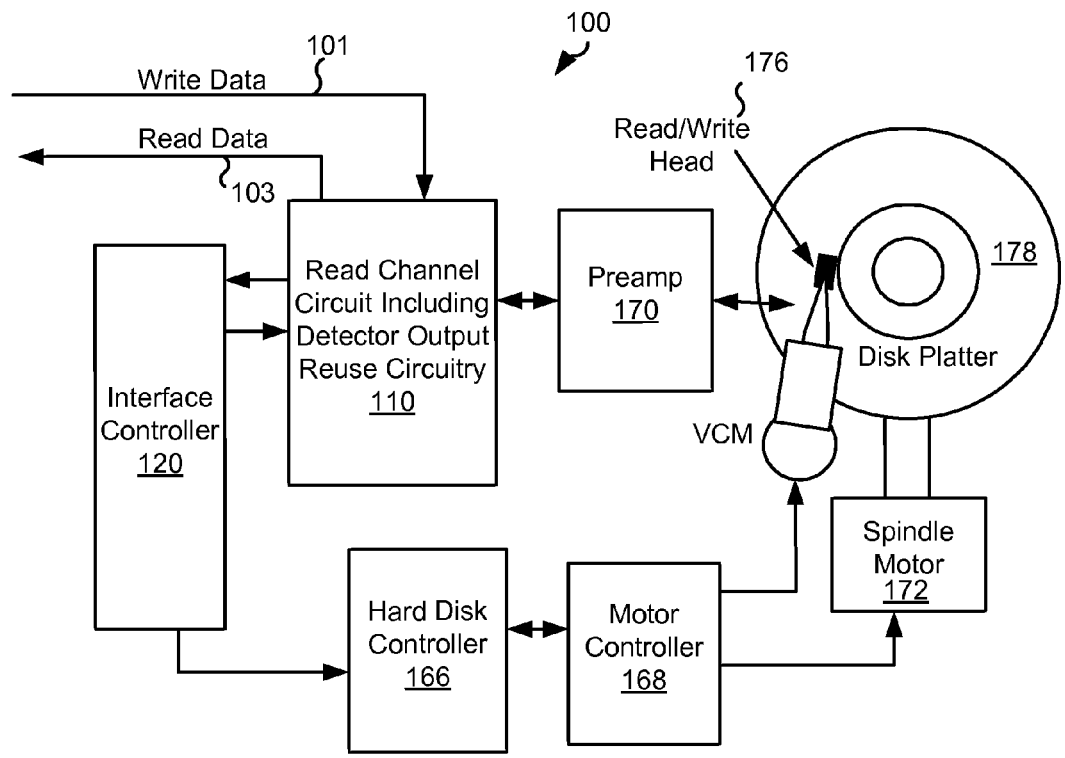
FIG. 1 shows a storage system including detector output reuse circuitry in accordance with various embodiments of the present invention.

The present inventions are related to systems and methods for data processing, and more particularly to systems and methods for use of a detector output by a data decoder.

Iterative data processing may include a data detector circuit that applies a data detection algorithm to a data set to yield a detected output, and a data decoder circuit that applies a data decoding algorithm to a decoder input derived from the detected output to yield a decoded output. The process of passing data through both the data detector circuit and the data decoder circuit is referred to herein as a "global iteration". During each global iteration, the data decoding algorithm may be repeatedly applied to a processing data set. This reapplication of the data decoding algorithm is referred to herein as a "local iteration". In particular embodiments of the present invention, a default number of ten local iterations are allowed for each global iteration. Based upon the disclosure provided herein, one of ordinary skill in the art will recognize a variety of numbers of local iterations that may be used as a default in relation to different embodiments of the present invention. In some circuits where out of order result reporting is allowed, a large number of global iterations (e.g., 120) for a given data set may be supported.

Some embodiments of the present invention provide data processing systems that include: a data detector circuit, a combining circuit, and a data decoder circuit. The data detector circuit is operable to apply a data detection algorithm to a data input to yield a first detector output, and to reapply the data detection algorithm to the data input to yield a second detector output. The combining circuit is operable to combine a first input derived from the first detector output with a second input derived from the second detector output to yield a combined detector output. The data decoder circuit is operable to apply a data decoding algorithm to a decoder input derived from the combined detector output to yield a decoded output. In some instances of the aforementioned embodiments, the decoder input is a first instance of the decoder input, and in reapplying the data detection algorithm to the data input to yield the second detector output is guided by a second instance of the decoder input. In some cases, the system is implemented as an integrated circuit. In various cases, the system is implemented as part of a communication device, and in other cases, the system is implemented as part of a storage device. In one or more cases, the data decoder circuit is a low density parity check decoder circuit. In some cases, the data detection algorithm is a Viterbi data detection algorithm. In other cases, the data detection algorithm is a maximum a posterior data detection algorithm.

In some instances of the aforementioned embodiments, applying the data detection algorithm and applying the data decoding algorithm at least one time corresponds to a global iteration. In such instances, the combining the first input and the second input is done in a proportion based upon a number of global iterations. In some cases, the first input and the second input are combined in a first proportion when a number of global iterations is less than a threshold value. In such cases, the first input and the second input are combined in a second proportion when the number of global iterations is greater than the threshold value. In various cases, the combined detector output is a first combined detector output, and the threshold value is a first threshold value. In such cases, the data detector circuit may be further operable to apply the data detection algorithm to the data input to yield a third detector output where the third detector output occurs coincident to the first threshold value. The combining circuit is further operable to combine the second input with a third input derived from the third detector output to yield a second combined detector output when the number of global iterations is equal to a second threshold value.

In other instances of the aforementioned embodiments, the data decoder circuit is further operable to provide a number of unsatisfied checks remaining in the decoded output, and the combining circuit is operable to combine the first input with the second input in a proportion based upon the number of unsatisfied checks. In yet other instances of the aforementioned embodiments, the combining circuit is further operable to generate a quality metric indicative of a quality of an element of the first input, and the combining circuit is operable to combine the first input with the second input in a proportion based upon the quality metric.

Other embodiments of the present invention provide methods for data processing that include: applying a data detection algorithm using a data detector circuit to a data input to yield a first detector output; re-applying the data detection algorithm using the data detector circuit to the data input to yield a second detector output; combining a first input derived from the first detector output with a second input derived from the second detector output to yield a combined detector output; and applying a data decoding algorithm using a data decoder circuit to a decoder input derived from the combined detector output to yield a decoded output. In some instances of the aforementioned embodiments, applying the data detection algorithm and applying the data decoding algorithm at least one time corresponds to a global iteration, and the first input and the second input in a proportion based upon a number of global iterations. In some cases, the first input and the second output are combined in a first proportion when a number of global iterations is less than a threshold value, and the first input and the second input are combined in a second proportion when the number of global iterations is greater than the threshold value. In some particular cases, the combined detector output is a first combined detector output, and the threshold value is a first threshold value. In such cases, the methods further include: re-applying the data detection algorithm to the data input to yield a third detector output where the third detector output occurs coincident to the first threshold value. The combining the second input with a third input derived from the third detector output to yield a second combined detector output when the number of global iterations is equal to a second threshold value.

In other instances of the aforementioned embodiments, the methods further include: generating a number of unsatisfied checks remaining in the decoded output, and the combining the first input with the second input is done in a proportion based upon the number of unsatisfied checks. In yet other instances of the aforementioned embodiments, the methods further include: generating a quality metric indicative of a quality of an element of the first input, and the combining the first input with the second input is done in a proportion based upon the quality metric.

Turning to FIG. 1, a storage system 100 including a read channel circuit 110 having detector output reuse circuitry is shown in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103. The opposite is a write operation where write data 101 is provided to read channel circuit 110 that encodes the data and stores it to disk platter 178 via preamplifier 170 and read/write head assembly 176.

As part of processing data accessed from disk platter 178, read channel circuit 110 applies a data detection algorithm to data accessed from disk platter 178 to yield a detected output. Under some conditions, a prior detected output may be combined with the current detected output to yield a combined detected output. A data decoder circuit applies a data decode algorithm to the combined detected output to yield a decoder output. Where the decoder output does not exhibit any remaining errors, it is provided as read data 103. In some cases, read channel circuit 110 may include a data processing circuit similar to that discussed below in relation to FIG. 3 or FIG. 5 below, and may operate similar to that discussed below in relation to FIGS. 7a-7c below.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platted 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
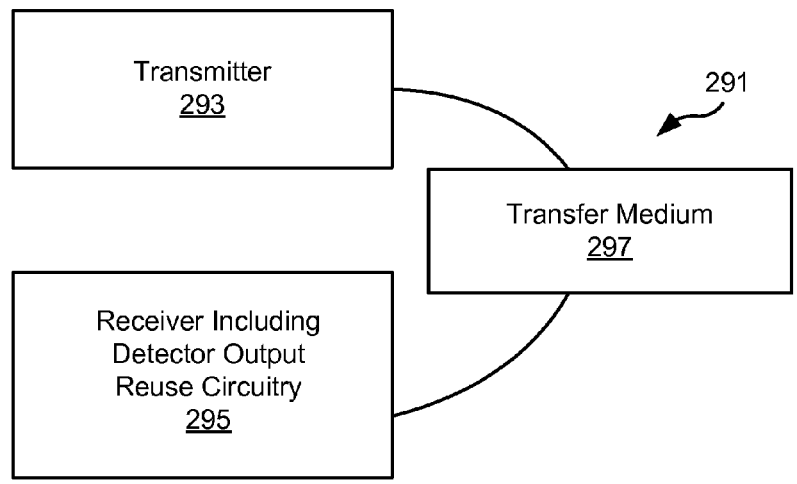
FIG. 2 depicts a data transmission system including detector output reuse circuitry in accordance with one or more embodiments of the present invention.

Turning to FIG. 2, a data transmission system 291 including a receiver 295 having floating variance calibration and detection circuitry is shown in accordance with various embodiments of the present invention. Data transmission system 291 includes a transmitter 293 that is operable to transmit encoded information via a transfer medium 297 as is known in the art. The encoded information is received from transfer medium 297 by a receiver 295. Receiver 295 processes a received input representing the encoded information to yield the originally transmitted data.

As part of processing data received by receiver 295, receiver 295 applies a data detection algorithm to data received from transfer medium 297 to yield a detected output. Under some conditions, a prior detected output may be combined with the current detected output to yield a combined detected output. A data decoder circuit applies a data decode algorithm to the combined detected output to yield a decoder output. Where the decoder output does not exhibit any remaining errors, it is provided as a data output. In some cases, receiver 295 may include a data processing circuit similar to that discussed below in relation to FIG. 3 or FIG. 5 below, and may operate similar to that discussed below in relation to FIGS. 7a-7c below.

Figure 3:
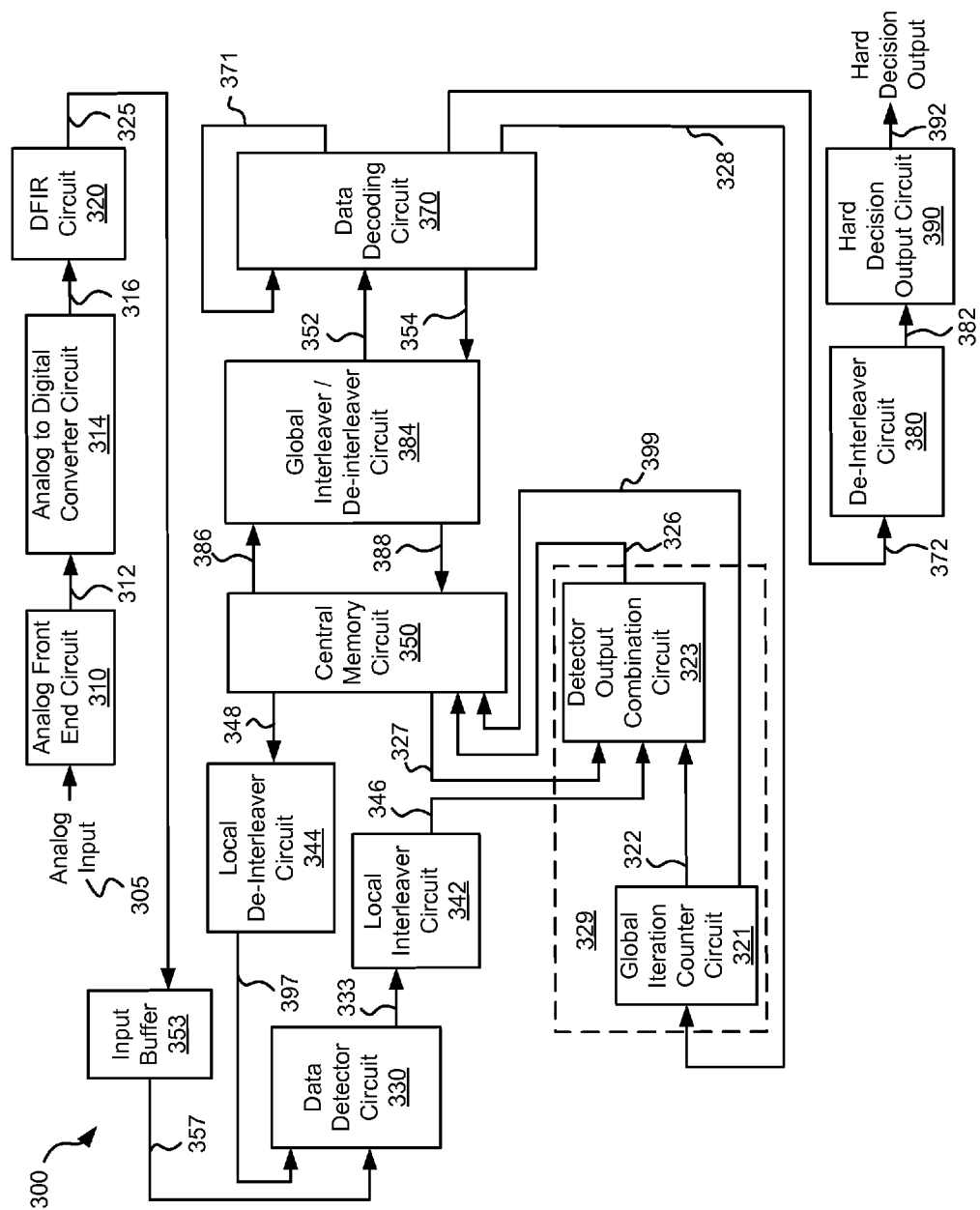
FIG. 3 shows a data processing system including detector output reuse circuitry in accordance with some embodiments of the present invention.

Turning to FIG. 3, a data processing system 300 including detector output reuse circuitry is shown in accordance with some embodiments of the present invention. Data processing system 300 includes an analog front end circuit 310 that receives an analog signal 305. Analog front end circuit 310 processes analog signal 305 and provides a processed analog signal 312 to an analog to digital converter circuit 314. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog signal 305 is derived from a read/write head assembly (not shown) that is disposed in relation to a storage medium (not shown). In other cases, analog signal 305 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 305 may be derived.

Analog to digital converter circuit 314 converts processed analog signal 312 into a corresponding series of digital samples 316. Analog to digital converter circuit 314 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 316 are provided to an equalizer circuit 320. Equalizer circuit 320 applies an equalization algorithm to digital samples 316 to yield an equalized output 325. In some embodiments of the present invention, equalizer circuit 320 is a digital finite impulse response filter circuit as are known in the art. It may be possible that equalized output 325 may be received directly from a storage device in, for example, a solid state storage system. In such cases, analog front end circuit 310, analog to digital converter circuit 314 and equalizer circuit 320 may be eliminated where the data is received as a digital data input. Equalized output 325 is stored to an input buffer 353 that includes sufficient memory to maintain one or more codewords until processing of that codeword is completed through a data detector circuit 330 and a data decoding circuit 370 including, where warranted, multiple global iterations (passes through both data detector circuit 330 and data decoding circuit 370) and/or local iterations (passes through data decoding circuit 370 during a given global iteration). An output 357 is provided to data detector circuit 330.

Data detector circuit 330 may be a single data detector circuit or may be two or more data detector circuits operating in parallel on different codewords. Whether it is a single data detector circuit or a number of data detector circuits operating in parallel, data detector circuit 330 is operable to apply a data detection algorithm to a received codeword or data set. In some embodiments of the present invention, data detector circuit 330 is a Viterbi algorithm data detector circuit as are known in the art. In other embodiments of the present invention, data detector circuit 330 is a is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 330 is used to apply the data detection algorithm to the received codeword for a first global iteration applied to the received codeword, and another data detector included in data detector circuit 330 is operable apply the data detection algorithm to the received codeword guided by a decoded output accessed from a central memory circuit 350 on subsequent global iterations.

Upon completion of application of the data detection algorithm to the received codeword on the first global iteration, data detector circuit 330 provides a detector output 333. Detector output 333 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detector output 333 is provided to a local interleaver circuit 342. Local interleaver circuit 342 is operable to shuffle sub-portions (i.e., local chunks) of the data set included as detected output and provides an interleaved codeword 346. Interleaver circuit 342 may be any circuit known in the art that is capable of shuffling data sets to yield a re-arranged data set.

Interleaved codeword 346 is provided to an output combination circuit 329 where it is combined with a previous interleaved codeword 327 accessed from central memory circuit 350 to yield a combined output 326. Previous interleaved codeword 327 is derived from a detector output 333 resulting from a previous global iteration. Combined output 326 is stored to central memory circuit 350 as the current interleaved output, and the previous interleaved output is updated to be the current interleaved output in preparation for the next global iteration. The operation of output combination circuit 329 is discussed below in more detail.

Once a data decoding circuit 370 is available, the current interleaved output (i.e., the current instance of combined codeword 326) is accessed from central memory circuit 350 as a stored codeword 386 and globally interleaved by a global interleaver/de-interleaver circuit 384. Global interleaver/De-interleaver circuit 384 may be any circuit known in the art that is capable of globally rearranging codewords. Global interleaver/De-interleaver circuit 384 provides a decoder input 352 into data decoding circuit 370. In some embodiments of the present invention, the data decode algorithm is a low density parity check algorithm as are known in the art. Based upon the disclosure provided herein, one of ordinary skill in the art will recognize other decode algorithms that may be used in relation to different embodiments of the present invention. Data decoding circuit 370 applies a data decode algorithm to decoder input 352 to yield a decoded output 371. In cases where another local iteration (i.e., another pass through data decoder circuit 370) is desired, data decoding circuit 370 re-applies the data decode algorithm to decoder input 352 guided by decoded output 371. This continues until either a maximum number of local iterations is exceeded or decoded output 371 converges.

Where decoded output 371 fails to converge (i.e., fails to yield the originally written data set) and a number of local iterations through data decoder circuit 370 exceeds maximum number of allowable local iterations, the resulting decoded output is provided as a decoded output 354 back to central memory circuit 350 where it is stored awaiting another global iteration through a data detector circuit included in data detector circuit 330. Prior to storage of decoded output 354 to central memory circuit 350, decoded output 354 is globally de-interleaved to yield a globally de-interleaved output 388 that is stored to central memory circuit 350. The global de-interleaving reverses the global interleaving earlier applied to stored codeword 386 to yield decoder input 352. When a data detector circuit included in data detector circuit 330 becomes available, a previously stored de-interleaved output 388 accessed from central memory circuit 350 and locally de-interleaved by a de-interleaver circuit 344. De-interleaver circuit 344 re-arranges decoder output 348 to reverse the shuffling originally performed by interleaver circuit 342. A resulting de-interleaved output 397 is provided to data detector circuit 330 where it is used to guide subsequent detection of a corresponding data set previously received as equalized output 325.

Alternatively, where the decoded output converges (i.e., yields the originally written data set), the resulting decoded output is provided as an output codeword 372 to a de-interleaver circuit 380. De-interleaver circuit 380 rearranges the data to reverse both the global and local interleaving applied to the data to yield a de-interleaved output 382. De-interleaved output 382 is provided to a hard decision output circuit 390. Hard decision output circuit 390 is operable to re-order data sets that may complete out of order back into their original order. The originally ordered data sets are then provided as a hard decision output 392.

Data decoding circuit 370 provides an end of global iteration output 328 to output combination circuit 329. End of global iteration output 328 is asserted high when the last local iteration is applied by data decoding circuit 370 to a given data set. Output combination circuit 329 includes a global iteration counter circuit 321 that is incremented each time end of global iteration output 328 is asserted to yield a global iteration count 322. Of note, data processing system 300 is operable to process multiple data sets (i.e., sets of equalized data stored in input buffer 353) concurrently. Thus, global iteration counter circuit 321 maintains a count of the number of global iterations for each of the data sets maintained in input buffer 353. In addition, output combination circuit 329 includes a detector output combination circuit 323 that generates combined output 326 as a combination of interleaved codeword 346 and previous interleaved codeword 327 based upon global iteration count 322 for the currently processing data set. As an example, for a first number of global iterations, detector output combination circuit 323 may set combined output 326 equal to interleaved codeword 346. For a subsequent number of global iterations, detector output combination circuit 323 may calculate combined output 326 as a weighted average of interleaved codeword 346 and previous interleaved codeword 327.

Figure 4A:
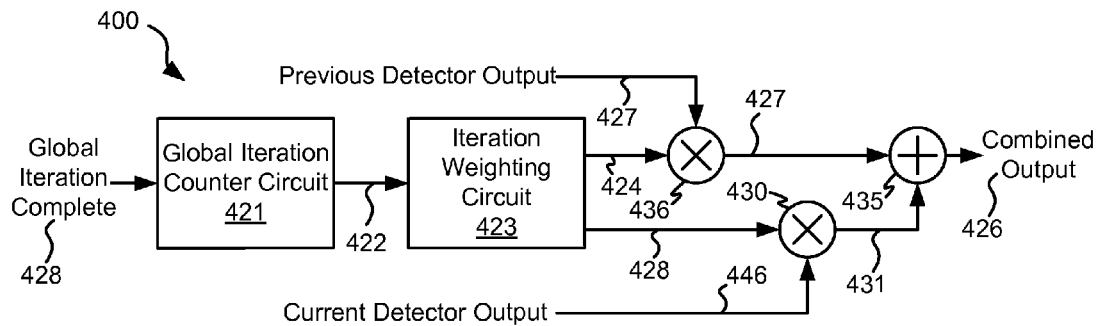
FIG. 4a shows one implementation of a data detector output combination circuit that may be used in relation to the embodiments of FIG. 3.

Turning to FIG. 4a, one implementation of a data detector output combination circuit 400 is shown in accordance with some embodiments of the present invention. In some cases, data detector output combination circuit 400 may be used in place of output combination circuit 329. In such cases, a global iteration complete signal 428 is connected to global iteration output 328, a previous detector output 427 is connected to previous interleaved output 327, a current detector output 446 is connected to interleaved output 346, and a combined output 426 is connected to combined output 326.

Figure 4B:
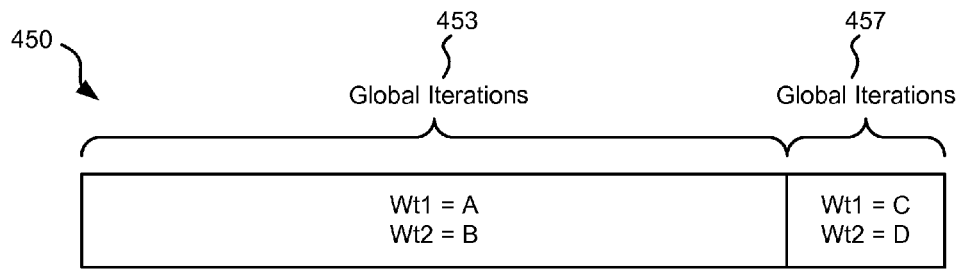
FIGS. 4b-4c show different uses of the data detector output combination circuit of FIG. 4a that may be used in relation to various embodiments of the present invention.

Data detector output combination circuit 400 includes a global iteration counter circuit 421 that is incremented each time global iteration complete signal 428 is asserted to yield a global iteration count 422. Global iteration count 422 is provided to a iteration weighting circuit 423 that provides a previous data scalar value (Wt1) 424 and a current data scalar value (Wt2) 428. Previous detector output 427 is multiplied by previous data scalar value 424 by a multiplier circuit 436 to yield a previous product 427; and current detector output 446 is multiplied by current data scalar value 428 by a multiplier circuit 430 to yield a current product 431. A summation circuit 430 adds current product 431 to previous product 427 to yield combined output 426. As shown in a timing diagram 450 of FIG. 4b, the values of Wt1 and Wt2 change after application of a defined number of global iterations 453, with the new values being applied for a subsequent number of global iterations 457. In particular, where the number of global iterations is less than global iterations 453, the scalar values are, respectively:

Wt1=A and
Wt2=B.

In one particular embodiment of the present invention, the value of A is zero (0), and the value of B is one (1). Where the number of global iterations is greater than or equal to global iterations 453, the scalar values are, respectively:

Wt1=C; and
Wt2=D.

In one particular embodiment of the present invention, the value of C is one (1), and the value of D is three (3). Based upon the disclosure provided herein, one of ordinary skill in the art will recognize a variety of different values for A, B, C and D that may be used in relation to different embodiments of the present invention. In one particular embodiment of the present invention, the number of global iterations 453 is one hundred ten (110). Based upon the disclosure provided herein, one of ordinary skill in the art will recognize a variety of different values for the number of global iterations 453 that may be used in relation to different embodiments of the present invention. Such values may be either fixed or programmable.

Figure 4C:
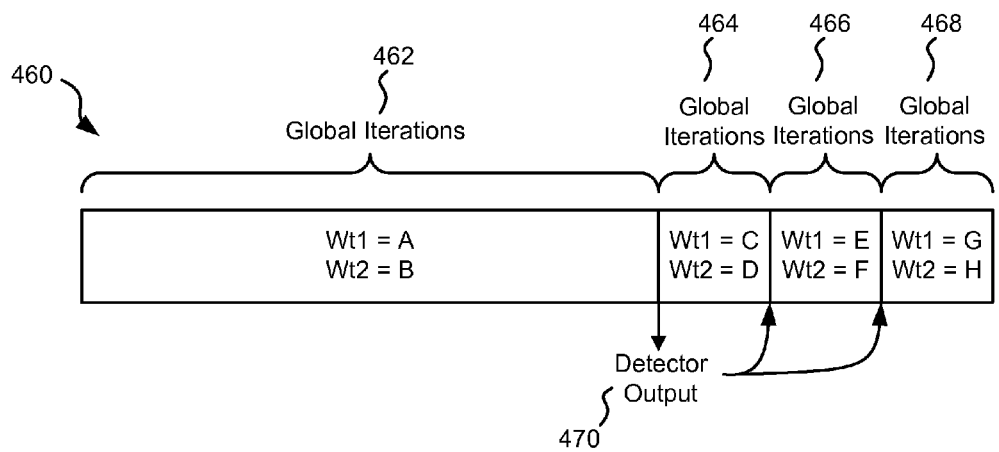

As shown in a timing diagram 460 of FIG. 4c, the values of Wt1 and Wt2 change after application of a defined number of global iterations 462, with the new values being applied for a subsequent number of global iterations 464. In particular, where the number of global iterations is less than global iterations 462, the scalar values are, respectively:

Wt1=A; and
Wt2=B.

In one particular embodiment of the present invention, the value of A is zero (0), and the value of B is one (1). Where the number of global iterations is greater than or equal to global iterations 464, and less than global iterations 462 plus global iterations 464, the scalar values are, respectively:

Wt1=C; and
Wt2=D.

In one particular embodiment of the present invention, the value of C is one (1), and the value of D is three (3). During global iterations 464, the initial processing is applied to a detector output 470 (i.e., the detector output at the end of global iterations 462).

Where the decoding fails to converge after global iterations 462 plus global iterations 464, the scalar values are changed to:

Wt1=E; and
Wt2=F.

In one particular embodiment of the present invention, the value of E is one (1), and the value of D is two (2). During global iterations 466, the initial processing is applied to a detector output 470 (i.e., the detector output at the end of global iterations 462), and the detector output at the end of global iterations 464 is discarded. Where the decoding fails to converge after global iterations 462 plus global iterations 464 and global iterations 466, the scalar values are again changed to:

Wt1=G; and
Wt2=H.

In one particular embodiment of the present invention, the value of E is one (1), and the value of D is four (4). During global iterations 468, the initial processing is applied to a detector output 470 (i.e., the detector output at the end of global iterations 462), and the detector output at the end of global iterations 466 is discarded. Such an approach of changing scaling factors and reverting back to an earlier detector output allows for the use of multiple different pairs of scaling factors with propagating any results of a failed set of scaling factors. Based upon the disclosure provided herein, one of ordinary skill in the art will recognize a variety of different values for A, B, C, D, E, F, G and H that may be used in relation to different embodiments of the present invention. Such values may be either fixed or programmable. In one particular embodiment of the present invention, the number of global iterations 453 is ninety (90), and each of the number of global iterations 464, 466, 468 are ten (10). Based upon the disclosure provided herein, one of ordinary skill in the art will recognize a variety of different values for the respective numbers of global iterations that may be used in relation to different embodiments of the present invention. Such values may be either fixed or programmable.

Figure 5:
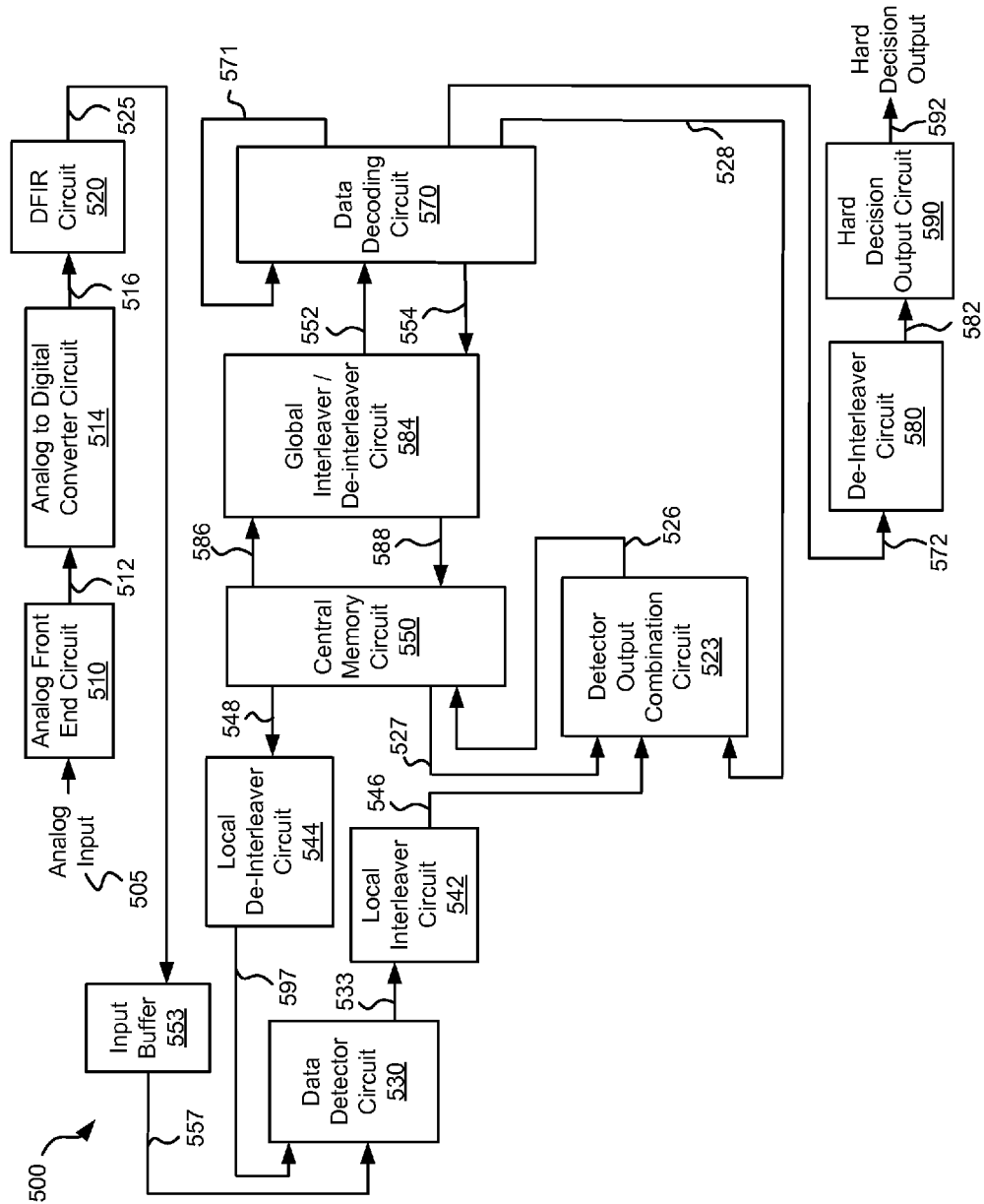
FIG. 5 depicts another data processing system including detector output reuse circuitry in accordance with some embodiments of the present invention.

Turning to FIG. 5, another data processing system 500 including detector output reuse circuitry is shown in accordance with some embodiments of the present invention. Data processing system 500 includes an analog front end circuit 510 that receives an analog signal 505. Analog front end circuit 510 processes analog signal 505 and provides a processed analog signal 512 to an analog to digital converter circuit 514. Analog front end circuit 510 may include, but is not limited to, an analog filter and an amplifier circuit as are known in the art. Based upon the disclosure provided herein, one of ordinary skill in the art will recognize a variety of circuitry that may be included as part of analog front end circuit 510. In some cases, analog signal 505 is derived from a read/write head assembly (not shown) that is disposed in relation to a storage medium (not shown). In other cases, analog signal 505 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 505 may be derived.

Analog to digital converter circuit 514 converts processed analog signal 512 into a corresponding series of digital samples 516. Analog to digital converter circuit 514 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 516 are provided to an equalizer circuit 520. Equalizer circuit 520 applies an equalization algorithm to digital samples 516 to yield an equalized output 525. In some embodiments of the present invention, equalizer circuit 520 is a digital finite impulse response filter circuit as are known in the art. It may be possible that equalized output 525 may be received directly from a storage device in, for example, a solid state storage system. In such cases, analog front end circuit 510, analog to digital converter circuit 514 and equalizer circuit 520 may be eliminated where the data is received as a digital data input. Equalized output 525 is stored to an input buffer 553 that includes sufficient memory to maintain one or more codewords until processing of that codeword is completed through a data detector circuit 530 and a data decoding circuit 570 including, where warranted, multiple global iterations (passes through both data detector circuit 530 and data decoding circuit 570) and/or local iterations (passes through data decoding circuit 570 during a given global iteration). An output 557 is provided to data detector circuit 530.

Data detector circuit 530 may be a single data detector circuit or may be two or more data detector circuits operating in parallel on different codewords. Whether it is a single data detector circuit or a number of data detector circuits operating in parallel, data detector circuit 530 is operable to apply a data detection algorithm to a received codeword or data set. In some embodiments of the present invention, data detector circuit 530 is a Viterbi algorithm data detector circuit as are known in the art. In other embodiments of the present invention, data detector circuit 530 is a is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 530 is used to apply the data detection algorithm to the received codeword for a first global iteration applied to the received codeword, and another data detector circuit included in data detector circuit 530 is operable apply the data detection algorithm to the received codeword guided by a decoded output accessed from a central memory circuit 550 on subsequent global iterations.

Upon completion of application of the data detection algorithm to the received codeword on the first global iteration, data detector circuit 530 provides a detector output 533. Detector output 533 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detector output 533 is provided to a local interleaver circuit 542. Local interleaver circuit 542 is operable to shuffle sub-portions (i.e., local chunks) of the data set included as detected output and provides an interleaved codeword 546. Interleaver circuit 542 may be any circuit known in the art that is capable of shuffling data sets to yield a re-arranged data set.

Interleaved codeword 546 is provided to a detector output combination circuit 523 where it is combined with a previous interleaved codeword 527 accessed from central memory circuit 550 to yield a combined output 526. Previous interleaved codeword 527 is derived from a detector output 533 resulting from a previous global iteration. Combined output 526 is stored to central memory circuit 550 as the current interleaved output, and the previous interleaved output is updated to be the current interleaved output in preparation for the next global iteration. The operation of detector output combination circuit 523 is discussed below in more detail.

Once a data decoding circuit 570 is available, the current interleaved output (i.e., the current instance of combined codeword 526) is accessed from central memory circuit 550 as a stored codeword 586 and globally interleaved by a global interleaver/de-interleaver circuit 584. Global interleaver/De-interleaver circuit 584 may be any circuit known in the art that is capable of globally rearranging codewords. Global interleaver/De-interleaver circuit 584 provides a decoder input 552 into data decoding circuit 570. In some embodiments of the present invention, the data decode algorithm is a low density parity check algorithm as are known in the art. Based upon the disclosure provided herein, one of ordinary skill in the art will recognize other decode algorithms that may be used in relation to different embodiments of the present invention. Data decoding circuit 570 applies a data decode algorithm to decoder input 552 to yield a decoded output 571. In cases where another local iteration (i.e., another pass through data decoder circuit 570) is desired, data decoding circuit 570 re-applies the data decode algorithm to decoder input 552 guided by decoded output 571. This continues until either a maximum number of local iterations is exceeded or decoded output 571 converges.

Where decoded output 571 fails to converge (i.e., fails to yield the originally written data set) and a number of local iterations through data decoder circuit 570 exceeds maximum number of allowable local iterations, the resulting decoded output is provided as a decoded output 554 back to central memory circuit 550 where it is stored awaiting another global iteration through a data detector circuit included in data detector circuit 530. Prior to storage of decoded output 554 to central memory circuit 550, decoded output 554 is globally de-interleaved to yield a globally de-interleaved output 588 that is stored to central memory circuit 550. The global de-interleaving reverses the global interleaving earlier applied to stored codeword 586 to yield decoder input 552. When a data detector circuit included in data detector circuit 530 becomes available, a previously stored de-interleaved output 588 accessed from central memory circuit 550 and locally de-interleaved by a de-interleaver circuit 544. De-interleaver circuit 544 re-arranges decoder output 548 to reverse the shuffling originally performed by interleaver circuit 542. A resulting de-interleaved output 597 is provided to data detector circuit 530 where it is used to guide subsequent detection of a corresponding data set previously received as equalized output 525.

Alternatively, where the decoded output converges (i.e., yields the originally written data set), the resulting decoded output is provided as an output codeword 572 to a de-interleaver circuit 580. De-interleaver circuit 580 rearranges the data to reverse both the global and local interleaving applied to the data to yield a de-interleaved output 582. De-interleaved output 582 is provided to a hard decision output circuit 590. Hard decision output circuit 590 is operable to re-order data sets that may complete out of order back into their original order. The originally ordered data sets are then provided as a hard decision output 592.

Data decoding circuit 570 provides an unsatisfied check value 528 to detector output combination circuit 523. Unsatisfied check value 528 value indicates a number of errors remaining in decoder output 571 at the end of all local iterations through data decoder circuit 570 for a particular global iteration (i.e., at the end of the current global iteration). Detector output combination circuit 523 combines interleaved codeword 546 and previous interleaved codeword 527 based upon the number of remaining unsatisfied checks indicated by unsatisfied check value 528. Of note, data processing system 500 is operable to process multiple data sets (i.e., sets of equalized data stored in input buffer 553) concurrently. Thus, the number of unsatisfied checks that is used is specific to the currently processing data set.

Figure 6:
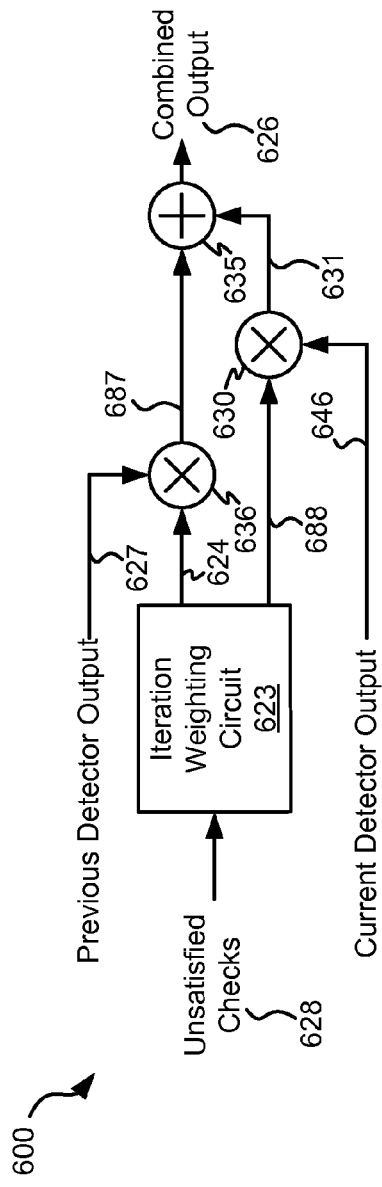
FIG. 6 shows an example implementation of a data detector output combination circuit that may be used in relation to the embodiments of FIG. 5.

Turning to FIG. 6, an example implementation of a data detector output combination circuit 600 is depicted that may be used in relation to the embodiments of data processing system 500. In some cases, data detector output combination circuit 600 may be used in place of output combination circuit 523. In such cases, an unsatisfied checks input 628 is connected to unsatisfied check value 528, a previous detector output 627 is connected to previous interleaved output 527, a current detector output 646 is connected to interleaved output 546, and a combined output 626 is connected to combined output 526.

Data detector output combination circuit 600 includes an iteration weighting circuit 623 that provides a previous data scalar value (Wt1) 624 and a current data scalar value (Wt2) 688. Previous detector output 627 is multiplied by previous data scalar value 624 by a multiplier circuit 636 to yield a previous product 687; and current detector output 646 is multiplied by current data scalar value 688 by a multiplier circuit 630 to yield a current product 631. A summation circuit adds current product 631 to previous product 687 to yield combined output 626.

In one particular embodiment of the present invention, the values of Wt1 and Wt2 are as follows when the number of unsatisfied checks is greater than one hundred twenty eight (128):
Wt1=A; and
Wt2=B.
In one particular embodiment of the present invention, the value of A is zero (0), and the value of B is one (1). Where, on the other hand, the number of unsatisfied checks is less than or equal to one hundred twenty eight (128) and greater than thirty two (32), the values of Wt1 and Wt2 are as follows:
Wt1=C; and
Wt2=D.
In one particular embodiment of the present invention, the value of C is one (1), and the value of D is three (3). Alternatively, where the number of unsatisfied checks is less than or equal to thirty two (32), the values of Wt1 and Wt2 are as follows:
Wt1=E; and
Wt2=F.
In one particular embodiment of the present invention, the value of C is one (1), and the value of D is three (4). Based upon the disclosure provided herein, one of ordinary skill in the art will recognize a variety of different values for A, B, C, D, E, F, G and H that may be used in relation to different embodiments of the present invention. Such values may be either fixed or programmable. It should be noted that other threshold values (i.e., values other than 128 and 32) may be selected in accordance with different embodiments of the present invention. Such values may be either fixed or programmable.

Figure 7:
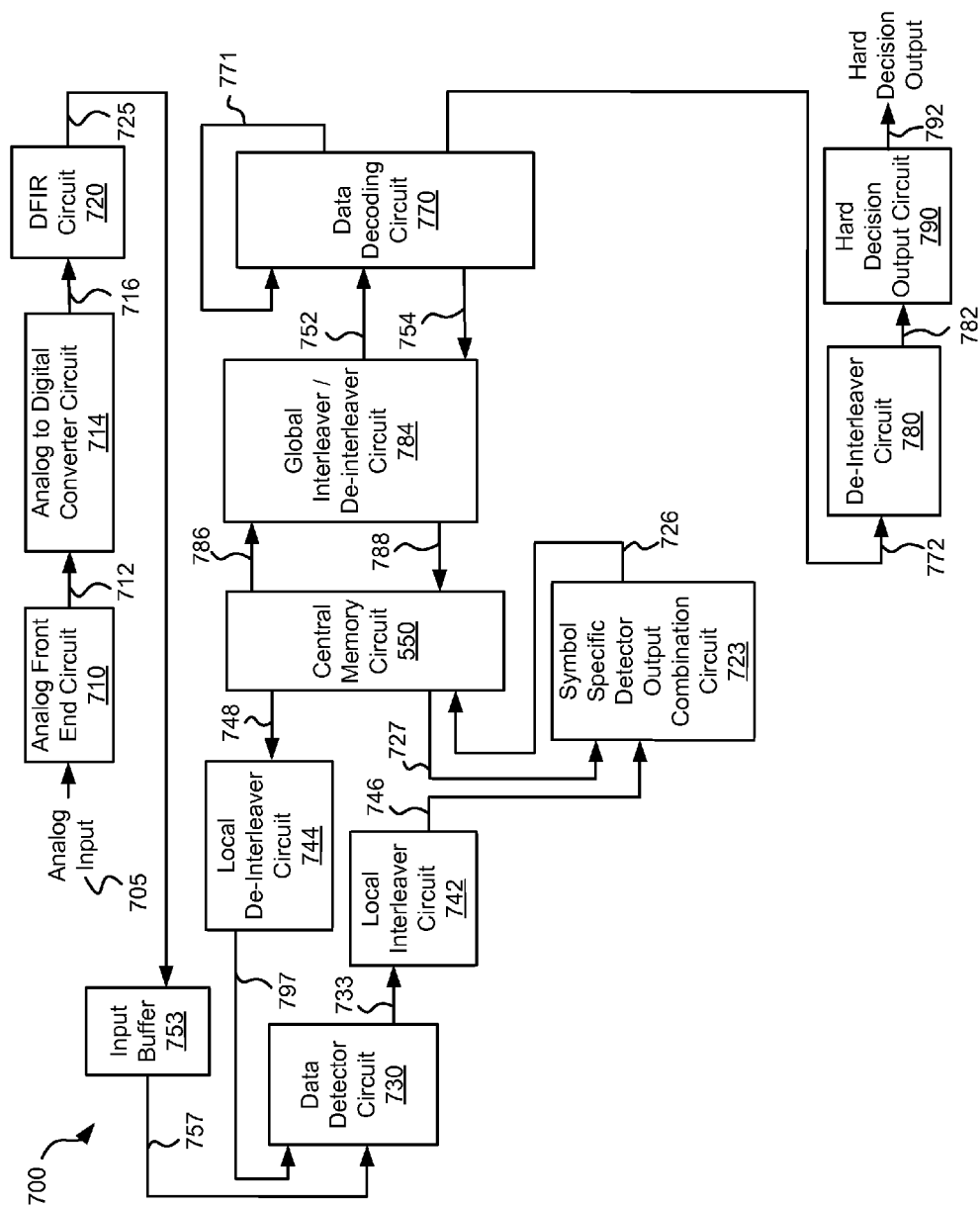
FIG. 7 depicts yet another data processing system including detector output reuse circuitry in accordance with some embodiments of the present invention.

Turning to FIG. 7, another data processing system 700 including detector output reuse circuitry is shown in accordance with some embodiments of the present invention. Data processing system 700 includes an analog front end circuit 710 that receives an analog signal 705. Analog front end circuit 710 processes analog signal 705 and provides a processed analog signal 712 to an analog to digital converter circuit 714. Analog front end circuit 710 may include, but is not limited to, an analog filter and an amplifier circuit as are known in the art. Based upon the disclosure provided herein, one of ordinary skill in the art will recognize a variety of circuitry that may be included as part of analog front end circuit 710. In some cases, analog signal 705 is derived from a read/write head assembly (not shown) that is disposed in relation to a storage medium (not shown). In other cases, analog signal 705 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 705 may be derived.

Analog to digital converter circuit 714 converts processed analog signal 712 into a corresponding series of digital samples 716. Analog to digital converter circuit 714 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 716 are provided to an equalizer circuit 720. Equalizer circuit 720 applies an equalization algorithm to digital samples 716 to yield an equalized output 725. In some embodiments of the present invention, equalizer circuit 720 is a digital finite impulse response filter circuit as are known in the art. It may be possible that equalized output 725 may be received directly from a storage device in, for example, a solid state storage system. In such cases, analog front end circuit 710, analog to digital converter circuit 714 and equalizer circuit 720 may be eliminated where the data is received as a digital data input. Equalized output 725 is stored to an input buffer 753 that includes sufficient memory to maintain one or more codewords until processing of that codeword is completed through a data detector circuit 730 and a data decoding circuit 770 including, where warranted, multiple global iterations (passes through both data detector circuit 730 and data decoding circuit 770) and/or local iterations (passes through data decoding circuit 770 during a given global iteration). An output 757 is provided to data detector circuit 730.

Data detector circuit 730 may be a single data detector circuit or may be two or more data detector circuits operating in parallel on different codewords. Whether it is a single data detector circuit or a number of data detector circuits operating in parallel, data detector circuit 730 is operable to apply a data detection algorithm to a received codeword or data set. In some embodiments of the present invention, data detector circuit 730 is a Viterbi algorithm data detector circuit as are known in the art. In other embodiments of the present invention, data detector circuit 730 is a is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 730 is used to apply the data detection algorithm to the received codeword for a first global iteration applied to the received codeword, and another data detector circuit included in data detector circuit 730 is operable apply the data detection algorithm to the received codeword guided by a decoded output accessed from a central memory circuit 750 on subsequent global iterations.

Upon completion of application of the data detection algorithm to the received codeword on the first global iteration, data detector circuit 730 provides a detector output 733. Detector output 733 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detector output 733 is provided to a local interleaver circuit 742. Local interleaver circuit 742 is operable to shuffle sub-portions (i.e., local chunks) of the data set included as detected output and provides an interleaved codeword 746. Interleaver circuit 742 may be any circuit known in the art that is capable of shuffling data sets to yield a re-arranged data set.

Interleaved codeword 746 is provided to a detector output combination circuit 723 where it is combined with a previous interleaved codeword 727 accessed from central memory circuit 750 to yield a combined output 726. Previous interleaved codeword 727 is derived from a detector output 733 resulting from a previous global iteration. Combined output 726 is stored to central memory circuit 750 as the current interleaved output, and the previous interleaved output is updated to be the current interleaved output in preparation for the next global iteration.

In a symbol based system, detector output combination circuit 723 determines a separation between the most likely symbol value and the second most likely symbol value. For example, where two bit symbols are used, four hard decision outputs are possible (0, 1, 2, 3), and interleaved codeword 746 provides four probability values corresponding to each of the respective outputs. In some embodiments of the present invention, the probability values are log likelihood ratio values. In such cases, detector output combination circuit 723 subtracts the second largest probability value from the largest probability value to yield a quality metric. A higher value quality metric corresponds to a higher quality detector output. Detector output combination circuit 723 combines interleaved codeword 746 and previous interleaved codeword 727 in a proportion based upon the quality.

Once a data decoding circuit 770 is available, the current interleaved output (i.e., the current instance of combined codeword 726) is accessed from central memory circuit 750 as a stored codeword 786 and globally interleaved by a global interleaver/de-interleaver circuit 784. Global interleaver/De-interleaver circuit 784 may be any circuit known in the art that is capable of globally rearranging codewords. Global interleaver/De-interleaver circuit 784 provides a decoder input 752 into data decoding circuit 770. In some embodiments of the present invention, the data decode algorithm is a low density parity check algorithm as are known in the art. Based upon the disclosure provided herein, one of ordinary skill in the art will recognize other decode algorithms that may be used in relation to different embodiments of the present invention. Data decoding circuit 770 applies a data decode algorithm to decoder input 752 to yield a decoded output 771. In cases where another local iteration (i.e., another pass through data decoder circuit 770) is desired, data decoding circuit 770 re-applies the data decode algorithm to decoder input 752 guided by decoded output 771. This continues until either a maximum number of local iterations is exceeded or decoded output 771 converges.

Where decoded output 771 fails to converge (i.e., fails to yield the originally written data set) and a number of local iterations through data decoder circuit 770 exceeds maximum number of allowable local iterations, the resulting decoded output is provided as a decoded output 754 back to central memory circuit 750 where it is stored awaiting another global iteration through a data detector circuit included in data detector circuit 730. Prior to storage of decoded output 754 to central memory circuit 750, decoded output 754 is globally de-interleaved to yield a globally de-interleaved output 788 that is stored to central memory circuit 750. The global de-interleaving reverses the global interleaving earlier applied to stored codeword 786 to yield decoder input 752. When a data detector circuit included in data detector circuit 730 becomes available, a previously stored de-interleaved output 788 accessed from central memory circuit 750 and locally de-interleaved by a de-interleaver circuit 744. De-interleaver circuit 744 re-arranges decoder output 748 to reverse the shuffling originally performed by interleaver circuit 742. A resulting de-interleaved output 797 is provided to data detector circuit 730 where it is used to guide subsequent detection of a corresponding data set previously received as equalized output 725.

Alternatively, where the decoded output converges (i.e., yields the originally written data set), the resulting decoded output is provided as an output codeword 772 to a de-interleaver circuit 780. De-interleaver circuit 780 rearranges the data to reverse both the global and local interleaving applied to the data to yield a de-interleaved output 782. De-interleaved output 782 is provided to a hard decision output circuit 790. Hard decision output circuit 790 is operable to re-order data sets that may complete out of order back into their original order. The originally ordered data sets are then provided as a hard decision output 792.

Figure 8:
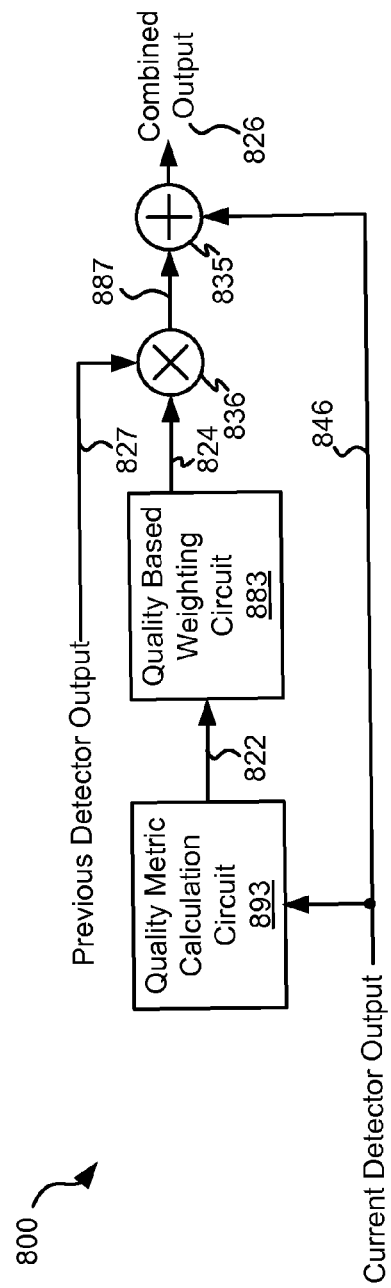
FIG. 8 shows an example implementation of a data detector output combination circuit that may be used in relation to the embodiments of FIG. 7.

Turning to FIG. 8, an example implementation of a data detector output combination circuit 800 is depicted that may be used in relation to the embodiments of data processing system 700. In some cases, data detector output combination circuit 800 may be used in place of output combination circuit 723. In such cases, a previous detector output 827 is connected to previous interleaved output 727, a current detector output 846 is connected to interleaved output 746, and a combined output 826 is connected to combined output 726.

Data detector output combination circuit 800 includes a quality metric calculation circuit 893 that subtracts the second largest probability value for a given symbol of current detector output 846 from the largest probability value for the given symbol of current detector output 846 to yield a quality metric 822. Quality metric 822 is provided to a quality based weighting circuit 883 that provides a previous data scalar value (Wt1) 824 based thereon. Previous detector output 827 is multiplied by previous data scalar value 824 by a multiplier circuit 836 to yield a previous product 887. A summation circuit adds previous product 887 to current detector output 846 to yield combined output 826.

In one particular embodiment of the present invention, the values of Wt1 is as follows: and Wt2 are as follows when the number of unsatisfied checks is greater than one hundred twenty eight (128):

$$Wt1 = \begin{cases} A, & \text{if } |\text{quality metric 822}| < \text{threshold } A \\ B, & \text{if threshold } A \leq |\text{quality metric 822}| < \text{threshold } B \\ C, & \text{if threshold } B \leq |\text{quality metric 822}| < \text{threshold } C \\ D, & \text{if } |\text{quality metric 822}| \geq \text{threshold } C \end{cases}$$

in one particular

The values of A, B, C, D, threshold A, threshold B, and threshold C may be wither fixed or programmable. Based upon the disclosure provided herein, one of ordinary skill in the art will recognize a variety of different values for A, B, C, D, threshold A, threshold B, and threshold C that may be used in relation to different embodiments of the present invention.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
    a data detector circuit operable to apply a data detection algorithm to a data input to yield a first detector output, and to reapply the data detection algorithm to the data input to yield a second detector output;
    a combining circuit operable to combine a first input derived from the first detector output with a second input derived from the second detector output to yield a combined detector output, wherein the combined detector output includes a unified data set element generated by combining an element of the first input with a corresponding element of the second input;
    a data decoder circuit operable to apply a data decoding algorithm to a decoder input derived from the combined detector output to yield a decoded output; and
    wherein applying the data detection algorithm and applying the data decoding algorithm at least one time corresponds to a global iteration, and wherein the combining circuit is operable to combine the element of the first input with the corresponding element of the second input in a first proportion when the data decoding algorithm failed to converge and a number of global iterations is less than a threshold value and a second proportion when the data decoding algorithm failed to converge and the number of global iterations is greater than the threshold value, and wherein the first proportion is different from the second proportion.

2. The data processing system of claim 1, wherein the decoder input is a first instance of the decoder input, and wherein reapplying the data detection algorithm to the data input to yield the second detector output is guided by a second instance of the decoder input.

3. The data processing system of claim 1, wherein the system is implemented as an integrated circuit.

4. The data processing system of claim 1, wherein the system is implemented as part of a device selected from a group consisting of: a communication device, and a storage device.

5. The data processing system of claim 1, wherein the data decoder circuit is a low density parity check decoder circuit.

6. The data processing system of claim 1, wherein the data detection algorithm is selected from a group consisting of: a Viterbi data detection algorithm, and a maximum a posterior data detection algorithm.

7. The data processing system of claim 1, wherein the combined detector output is a first combined detector output, wherein the threshold value is a first threshold value, wherein the data detector circuit is further operable to apply the data detection algorithm to the data input to yield a third detector output, wherein the third detector output occurs coincident to the first threshold value, and wherein the combining circuit is further operable to combine the second input with a third input derived from the third detector output to yield a second combined detector output when the number of global iterations is equal to a second threshold value.

8. A method for data processing, the method comprising:
applying a data detection algorithm using a data detector circuit to a data input to yield a first detector output;
re-applying the data detection algorithm using the data detector circuit to the data input to yield a second detector output;
combining a first input derived from the first detector output with a second input derived from the second detector output in a determined proportion to yield a combined detector output, wherein the determined proportion is selected from a group consisting of:
a first proportion when a data decoding algorithm failed to converge and a number of global iterations is less than a threshold value or a second proportion when the data decoding algorithm failed to converge and the number of global iterations is greater than the threshold value; and
a first proportion when a number of unsatisfied checks remaining in a decoded output is non-zero and exceeds a threshold value, and a second proportion when the number of unsatisfied checks is non-zero and is less than the threshold value; and
applying the data decoding algorithm using a data decoder circuit to a decoder input derived from the combined detector output to yield a decoded output and the number of unsatisfied checks remaining in the decoded output, wherein applying the data detection algorithm and applying the data decoding algorithm at least one time corresponds to the global iteration.

9. The method of claim 8, wherein the combined detector output is a first combined detector output, wherein the threshold value is a first threshold value, and wherein the method further comprises:
re-applying the data detection algorithm to the data input to yield a third detector output, wherein the third detector output occurs coincident to the first threshold value; and
combining the second input with a third input derived from the third detector output to yield a second combined detector output when the number of global iterations is equal to a second threshold value.

10. The method of claim 8, wherein the decoder input is a first instance of the decoder input, and wherein reapplying the data detection algorithm to the data input to yield the second detector output is guided by a second instance of the decoder input.

11. The method of claim 8, wherein the data decoder circuit is a low density parity check decoder circuit, and wherein the data detection algorithm is selected from a group consisting of: a Viterbi data detection algorithm, and a maximum a posterior data detection algorithm.

12. A data processing system, the data processing system comprising:
a data detector circuit operable to apply a data detection algorithm to a data input to yield a first detector output, and to reapply the data detection algorithm to the data input to yield a second detector output;
a combining circuit operable to combine a first input derived from the first detector output with a second input derived from the second detector output to yield a combined detector output;
a data decoder circuit operable to apply a data decoding algorithm to a decoder input derived from the combined detector output to yield a decoded output and a number of unsatisfied checks; and
wherein the combining circuit is operable to combine the first input with the second input in a first proportion when the number of unsatisfied checks is non-zero and exceeds a threshold value, and a second proportion when the number of unsatisfied checks is non-zero and is less than the threshold value.

13. The data processing system of claim 12, wherein the system is implemented as an integrated circuit.

14. The data processing system of claim 12, wherein the system is implemented as part of a device selected from a group consisting of: a communication device, and a storage device.

15. The data processing system of claim 12, wherein the system is implemented as an integrated circuit.

16. A data processing system, the data processing system comprising:
a data detector circuit operable to apply a data detection algorithm to a data input to yield a first detector output, and to reapply the data detection algorithm to the data input to yield a second detector output;
a combining circuit operable to combine a first input derived from the first detector output with a second input derived from the second detector output to yield a combined detector output;
a data decoder circuit operable to apply a data decoding algorithm to a decoder input derived from the combined detector output to yield a decoded output and a number of unsatisfied checks; and
wherein the combining circuit is further operable to generate a quality metric indicative of a quality of an element of the first input, and wherein the combining circuit is operable to combine the first input with the second input in a first proportion when a number of unsatisfied checks after application of the data decoding algorithm is non-zero and the quality metric exceeds a threshold value, and a second proportion when the number of unsatisfied checks is non-zero and the quality metric is less than the threshold value.

17. The data processing system of claim 16, wherein the system is implemented as an integrated circuit.

18. The data processing system of claim 16, wherein the system is implemented as part of a device selected from a group consisting of: a communication device, and a storage device.

19. The data processing system of claim 16, wherein the system is implemented as an integrated circuit.

20. The data processing system of claim 16, wherein the decoder input is a first instance of the decoder input, and wherein reapplying the data detection algorithm to the data input to yield the second detector output is guided by a second instance of the decoder input.

* * * * *